US011587881B2

(12) United States Patent
Chen et al.

(10) Patent No.: US 11,587,881 B2
(45) Date of Patent: Feb. 21, 2023

(54) SUBSTRATE STRUCTURE INCLUDING EMBEDDED SEMICONDUCTOR DEVICE

(71) Applicant: Advanced Semiconductor Engineering, Inc., Kaohsiung (TW)

(72) Inventors: Chien-Fan Chen, Kaohsiung (TW); Yu-Ju Liao, Kaohsiung (TW); Chu-Jie Yang, Kaohsiung (TW); Sheng-Hung Shih, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/813,369

(22) Filed: Mar. 9, 2020

(65) Prior Publication Data
US 2021/0280521 A1 Sep. 9, 2021

(51) Int. Cl.
*H01L 23/538* (2006.01)
*H01L 23/498* (2006.01)
*H01L 21/48* (2006.01)
*H01L 25/065* (2023.01)

(52) U.S. Cl.
CPC ........ *H01L 23/5389* (2013.01); *H01L 21/486* (2013.01); *H01L 21/4857* (2013.01); *H01L 23/49822* (2013.01); *H01L 23/49827* (2013.01); *H01L 23/49838* (2013.01); *H01L 23/49894* (2013.01); *H01L 25/0657* (2013.01)

(58) Field of Classification Search
CPC ........... H01L 23/5389; H01L 23/49822; H01L 23/49827; H01L 23/49838; H01L 23/49894
See application file for complete search history.

(56) References Cited

U.S. PATENT DOCUMENTS

| 7,294,920 | B2 | 11/2007 | Chen et al. |
| 9,373,605 | B1* | 6/2016 | Wang ............... H01L 23/5385 |
| 9,461,025 | B2 | 10/2016 | Yu et al. |
| 10,109,588 | B2* | 10/2018 | Jeong .............. H01L 23/49827 |
| 2010/0006330 | A1* | 1/2010 | Fu .................. H01L 23/49816 |
| | | | 174/260 |
| 2011/0062471 | A1 | 3/2011 | Bierhuizen et al. |
| 2014/0124919 | A1* | 5/2014 | Huang ................. H01L 24/97 |
| | | | 257/737 |

(Continued)

FOREIGN PATENT DOCUMENTS

| JP | 2017-191835 A | 10/2017 |
| JP | 2019-021904 A | 2/2019 |

(Continued)

OTHER PUBLICATIONS

Non-Final Office Action for U.S. Appl. No. 16/814,704, dated Jun. 1, 2021, 11 pages.

(Continued)

*Primary Examiner* — Michael Jung
(74) *Attorney, Agent, or Firm* — Foley & Lardner LLP (57) ABSTRACT

A substrate structure is disclosed. The substrate structure includes a carrier, a dielectric layer on the carrier, a patterned organic core layer in the dielectric layer, and a conductive via. The patterned organic core layer defines a passage extending in the dielectric layer towards the carrier. The conductive via extends through the passage towards the carrier without contacting the patterned organic core layer.

18 Claims, 10 Drawing Sheets

(56) References Cited

U.S. PATENT DOCUMENTS

| | | | |
|---|---|---|---|
| 2014/0175663 A1* | 6/2014 | Chen | H01L 23/49827 257/774 |
| 2015/0296625 A1* | 10/2015 | Jung | H05K 3/305 361/762 |
| 2017/0295643 A1 | 10/2017 | Suzuki et al. | |
| 2018/0114783 A1* | 4/2018 | Wang | H01L 23/4334 |
| 2018/0177045 A1 | 6/2018 | Schwarz et al. | |
| 2018/0358290 A1* | 12/2018 | Chen | H01L 21/4853 |
| 2018/0358302 A1 | 12/2018 | Tuominen et al. | |
| 2019/0181126 A1 | 6/2019 | Cheah et al. | |
| 2019/0215958 A1 | 7/2019 | Ishihara et al. | |
| 2019/0267307 A1* | 8/2019 | Lin | H01L 23/49838 |
| 2019/0267351 A1 | 8/2019 | Jo et al. | |
| 2020/0020624 A1* | 1/2020 | Kang | H01L 23/49833 |
| 2020/0075503 A1 | 3/2020 | Chuang et al. | |
| 2021/0125944 A1* | 4/2021 | Lambert | H01L 23/49838 |
| 2022/0230948 A1* | 7/2022 | Ogura | H01L 23/3107 |

FOREIGN PATENT DOCUMENTS

| | | |
|---|---|---|
| TW | 201901915 A | 1/2019 |
| WO | WO-2011/108308 A1 | 9/2011 |
| WO | WO-2016/181954 A1 | 11/2016 |
| WO | WO-2018/101384 A1 | 6/2018 |

OTHER PUBLICATIONS

Notice of Allowance for U.S. Appl. No. 16/814,704, dated Sep. 28, 2021, 7 pages.

Notice of Allowance for Taiwanese Patent Application No. 109122847, dated Jan. 22, 2022, 4 pages.

Search Report with English translation for Taiwanese Patent Application No. 109122847, dated Jan. 22, 2022, 2 pages.

Office Action and Search Report with English translation for Japanese Patent Application No. 2020-195425, dated Feb. 1, 2022, 6 pages.

Office Action for corresponding Taiwanese Patent Application No. 109122718, dated Mar. 2, 2022, 5 pages.

Search Report with English translation for corresponding Taiwanese Patent Application No. 109122718, dated Mar. 2, 2022, 2 pages.

* cited by examiner

SUBSTRATE STRUCTURE INCLUDING EMBEDDED SEMICONDUCTOR DEVICE

BACKGROUND

Field of the Disclosure

The present disclosure generally relates to a substrate and, in particular, to a substrate with a semiconductor device embedded therein.

Description of the Related Art

Embedded substrate technology is the inclusion of at least one active or passive electrical component within conductive layers of a substrate. The conductive layers facilitate electrical interconnection or signal transmission for an embedded electrical component. Embedded substrates are believed to reduce package size, increase power density and improve device performance, and thus have become increasingly popular.

SUMMARY

Embodiments of the present disclosure provide a substrate structure. The substrate structure includes a carrier, a dielectric layer on the carrier, a patterned organic core layer in the dielectric layer, and a conductive via. The patterned organic core layer defines a passage extending in the dielectric layer towards the carrier. In addition, the conductive via extends through the passage towards the carrier without contacting the patterned organic core layer.

Some embodiments of the present disclosure provide a substrate structure. The substrate structure includes a dielectric layer including a first surface and a second surface opposite to the first surface, a semiconductor device in the dielectric layer, a patterned organic core layer in the dielectric layer surrounding the semiconductor device, and a conductive via. The patterned organic core layer defines a passage between the first surface and the second surface. The dielectric layer has a higher removal rate than the patterned organic core layer with respect to a pulsed energy. In addition, the conductive via extends in the passage between the first surface and the second surface of the dielectric layer.

Embodiments of the present disclosure provide a method of manufacturing a substrate structure. The method includes providing a first carrier, attaching a patterned core layer over the first carrier, the patterned core layer including glass fibers and provided with a first opening that defines a passage extending towards the first carrier, forming a dielectric layer on the patterned core layer, the dielectric layer filling the first opening, and patterning the dielectric layer, resulting in a via extending through the passage towards the first carrier without contacting the patterned core layer.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
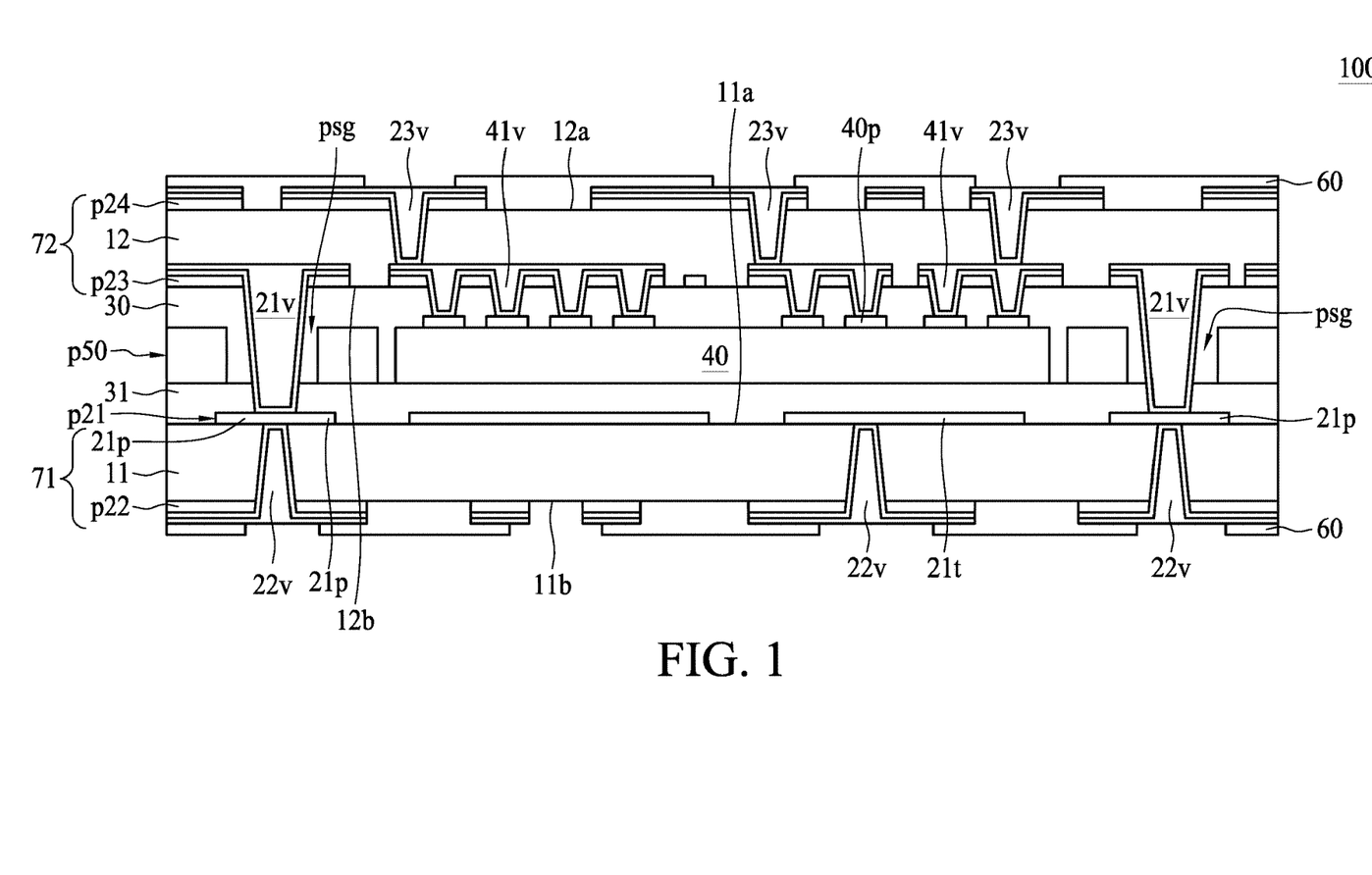
FIG. 1 is a cross-sectional view of a substrate structure, in accordance with an embodiment of the present disclosure.

FIG. 1 is a cross-sectional view of a substrate structure 100, in accordance with an embodiment of the present disclosure.

Referring to FIG. 1, the substrate structure 100 includes a dielectric layer 30, a patterned core layer p50 in the dielectric layer 30, and a semiconductor device 40 embedded in the dielectric layer 30 and surrounded by the patterned core layer p50. The semiconductor device 40 may include an active electrical component or a passive electrical component or both. The substrate structure 100 further includes a first connection structure 71 and a second connection structure 72 to provide electrical interconnection or signal transmission for the semiconductor device 40. The first connection structure 71 further includes a dielectric layer 11, a patterned first conductive film p21 on a first surface 11a of the dielectric layer 11, and a patterned second conductive film p22 on a second surface 11b of the dielectric layer 11. Moreover, the second connection structure 72 further includes a dielectric layer 12, a patterned first conductive foil p23 on a surface 12b of the dielectric layer 12, and a patterned second conductive foil p24 on a surface 12a of the dielectric layer 12.

The patterned core layer p50 defines a passage labeled as "psg" to allow a first conductive via 21v to extend therethrough between the patterned first conductive foil p23 and the patterned first conductive film p21. The passage psg defined in the patterned core layer p50 has a diameter larger than that of the first conductive via 21v. As a result, the first conductive via 21v extends in the passage psg without contacting the patterned core layer p50. The first conductive via 21v may be electrically connected via the patterned first conductive foil p23 to conductive pads 40p of the semiconductor device 40, or to third conductive vias 23v in the first connection structure 71, or both. In some embodiments, the first conductive via 21v is disposed over the patterned first conductive foil p23. For example, the first conductive via 21v covers a surface of the patterned first conductive foil p23.

The third conductive vias 23v, exposed at the patterned second conductive foil p24, may be electrically connected to electrical connectors such as solder balls, which may in turn electrically connected to an external semiconductor device. In addition, the first conductive via 21v may be electrically connected via the patterned first conductive film p21 to fourth conductive vias 22v in the second connection structure 72. The fourth conductive vias 22v, exposed at the patterned second conductive film p22, may be electrically connected to electrical connectors such as solder balls, which may in turn electrically connected to a printed circuit board (PCB). The patterned second conductive foil p24 and the patterned second conductive film p22 except, for example, where the third conductive vias 23v and the fourth conductive vias 22v are exposed, are covered by a protective coating 60 such as solder mask.

In some embodiments, a seed layer 21vs may be disposed between the dielectric layer 30 and the first conductive via 21v. In some embodiments, the seed layer 21vs may be disposed between the patterned first conductive foil p23 and the first conductive via 21v. In some embodiments, the seed layer 21vs may extend in the passage psg along with the first conductive via 21v. For the purpose of simplicity and clarity, the seed layers are omitted in the other figures.

Figure 2A:
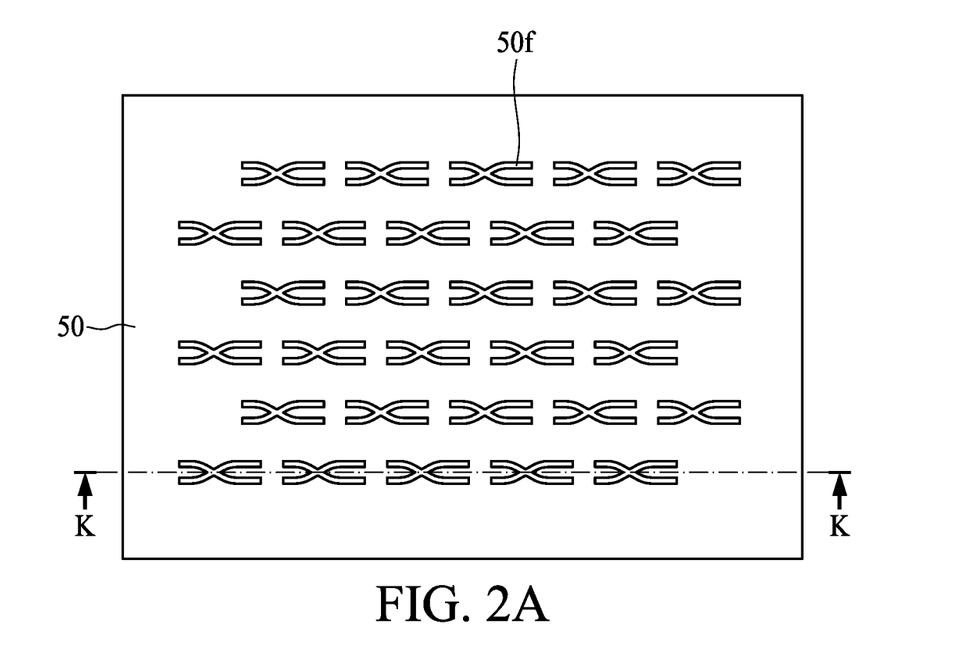
FIG. 2A is a schematic top view of an unpatterned core layer, in accordance with an embodiment of the present disclosure.
Figure 2B:
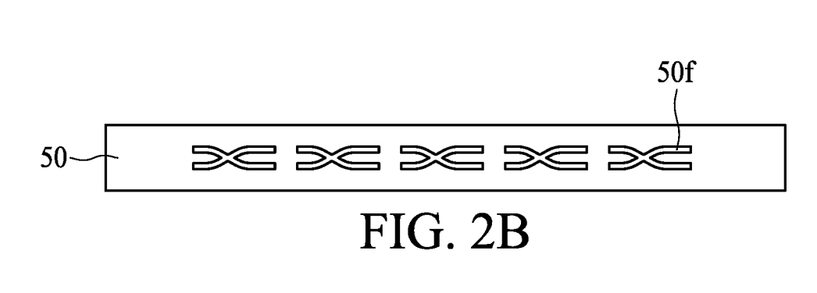
FIG. 2B is a cross-sectional view of the unpatterned core layer illustrated in FIG. 2A, taken along line KK'.

FIG. 2A is a schematic top view of an unpatterned core layer 50, in accordance with an embodiment of the present disclosure. FIG. 2B is a cross-sectional view of the unpatterned core layer 50 illustrated in FIG. 2A, taken along line KK'.

Referring to FIG. 2A, the unpatterned core layer 50 is provided with fillers 50f. In an embodiment, the fillers 50f include glass fibers. Suitable materials for the unpatterned core layer 50 include an organic material. In an embodiment, the unpatterned core layer 50 has a thickness ranging from approximately 50 μm to approximately 150 μm.

Figure 2C:
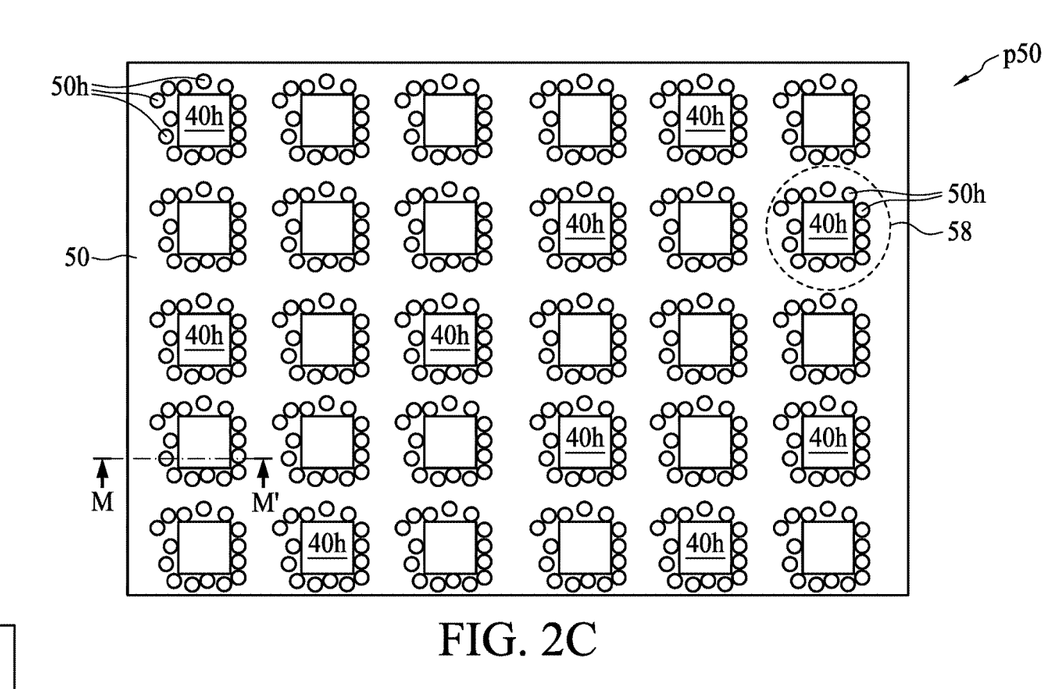
FIG. 2C is a schematic top view of a patterned core layer, in accordance with an embodiment of the present disclosure.

FIG. 2C is a schematic top view of a patterned core layer p50, in accordance with an embodiment of the present disclosure.

Referring to FIG. 2C, the patterned core layer p50 includes a plurality of units 58 each being provided with first openings 50h and second openings or cavities 40h. In the present embodiment, as shown in an exemplary unit 58, each of the second openings 40h is substantially surrounded by a plurality of first openings 50h in a predetermined pattern. The second opening 40h is sized to accommodate a semiconductor device 40, while the first opening 50h is designed to pass a conductive via for electrical interconnection of the semiconductor device 40. Therefore, the number of first openings 50h associated with a corresponding second opening 40h and their deployment pattern may depend on desired applications. The patterned core layer p50 may be formed by preparing an unpatterned core layer 50 as illustrated in FIG. 2A, and then forming first openings 50h and second openings 40h by a suitable process such as one of a laser drilling, mechanical drilling, punching, or blasting process.

Figure 2D:
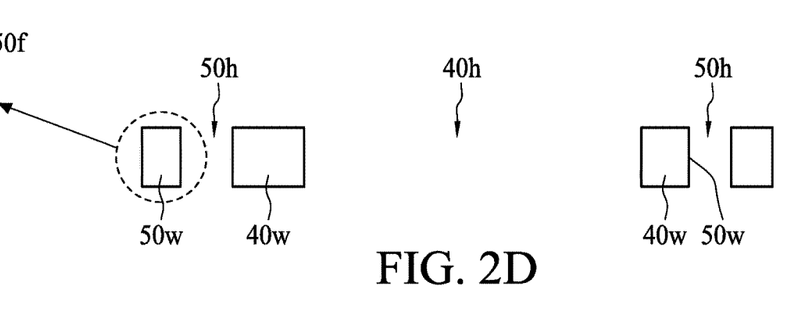
FIG. 2D is a cross-sectional view of the patterned core layer illustrated in FIG. 2C, taken along line MM'.

FIG. 2D is a cross-sectional view of the patterned core layer p50 illustrated in FIG. 2C, taken along line MM'.

Figure 2E:
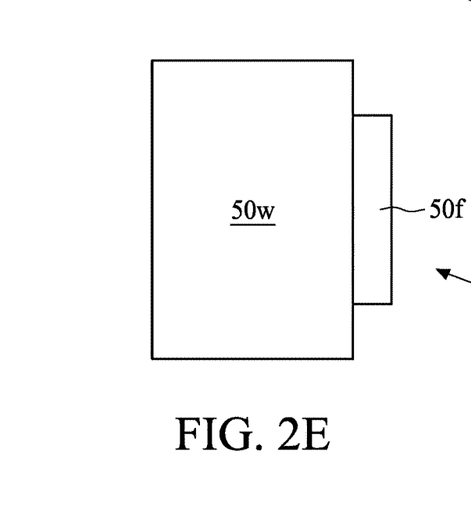
FIG. 2E is an enlarged view showing surface condition of a wall of the patterned core layer illustrated in FIG. 2D.

Referring to FIG. 2D, the first opening 50h defines a passage to allow a later formed conductive via to extend therethrough in order to provide electrical connection for a semiconductor device 40. The passage has a diameter larger than that of the conductive via. In forming the first opening 50h and the second opening 40h by using laser drilling, residual materials may occur in the walls 50w and 40w of the patterned core layer p50 that define the first opening 50h and the second opening 40h, respectively. Attention is drawn to the first opening 50h where a conductive via is to be formed therein at a later time. FIG. 2E is an enlarged view showing surface condition of a wall 50w of the patterned core layer p50 illustrated in FIG. 2D. Referring to FIG. 2E, residual glass fibers 50f may be exposed from the wall 50w. Since in the present disclosure, the first opening 50h is formed by drilling through a same material, i.e., the organic material of an unpatterned core layer, residual glass fibers, if any, may be insignificant. In some existing approaches, however, to form a conductive via, different materials are drilled in a drilling process and thus may result in significant residual glass fibers in a core layer. As will be discussed later in detail, such residual glass fibers are likely to cause electric disconnection of the later formed conductive via. In contrast, with the patterned core layer p50 according to the present disclosure, the problem with the existing approaches can be solved.

FIG. 3A through FIG. 3L illustrate cross-sectional views in one or more stages of a method of manufacturing a substrate structure in accordance with an embodiment of the present disclosure.

Figure 3A:
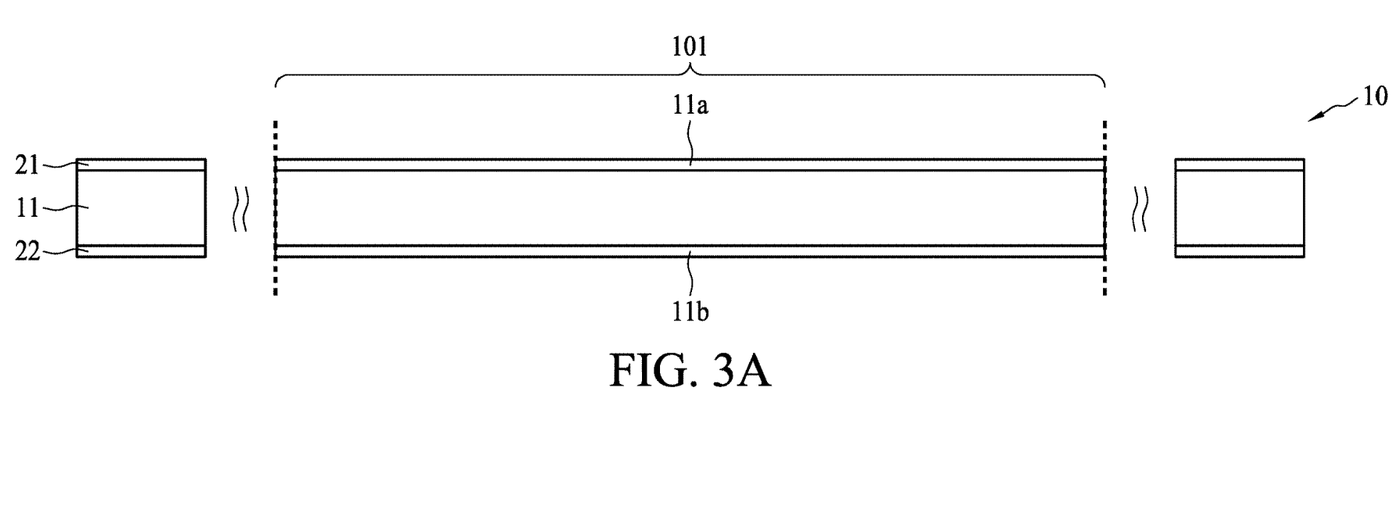
FIG. 3A through FIG. 3M illustrate cross-sectional views in one or more stages of a method of manufacturing a substrate structure in accordance with an embodiment of the present disclosure.

Referring to FIG. 3A, a first carrier 10, having a first surface 11a and a second surface 11b opposite to the first surface 11a, is provided. The first carrier 10 includes a first conductive film 21 on the first surface 11a, a second conductive film 22 on the second surface 11b, and a dielectric layer 11 between the first conductive film 21 and the second conductive film 22. The dielectric layer 11 may include an organic material that further includes fillers such as glass fibers. The first conductive film 21 and the second conductive film 22 may each include copper (Cu). In an embodiment, the dielectric layer 11 has a thickness ranging from approximately thirty-five (35) micrometers (μm) to approximately four hundred (400) μm. In addition, the first conductive film 21 and the second conductive film 22 may each have a thickness ranging from approximately 5 μm to approximately 18 μm.

In the present embodiment, the first carrier 10 includes a copper clad laminate (CCL) substrate, which includes several carrier units 101 that one may be separable from another by a scribe line (not shown). Since each of the carrier units 101 is subjected to similar or identical processes in the manufacturing method, for convenience, only an exemplary carrier unit 101 is illustrated and described in the following description.

Figure 3B:
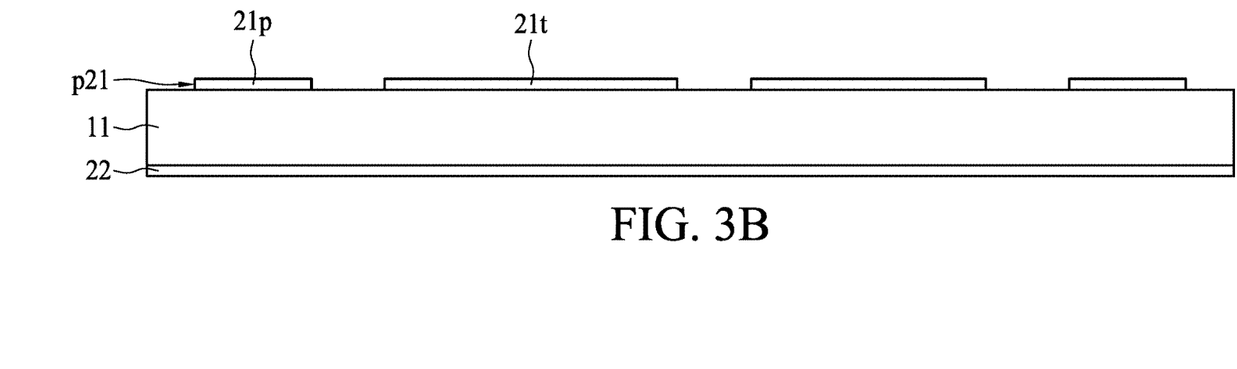

Referring to FIG. 3B, the first conductive film 21 is patterned in, for example, a lithographic process followed by an etching process, resulting in a patterned first conductive film p21. The patterned first conductive film p21 may include, also referring to FIG. 1, conductive pads 21p or conductive traces 21t or both to facilitate electric interconnection or signal transmission.

Figure 3C:
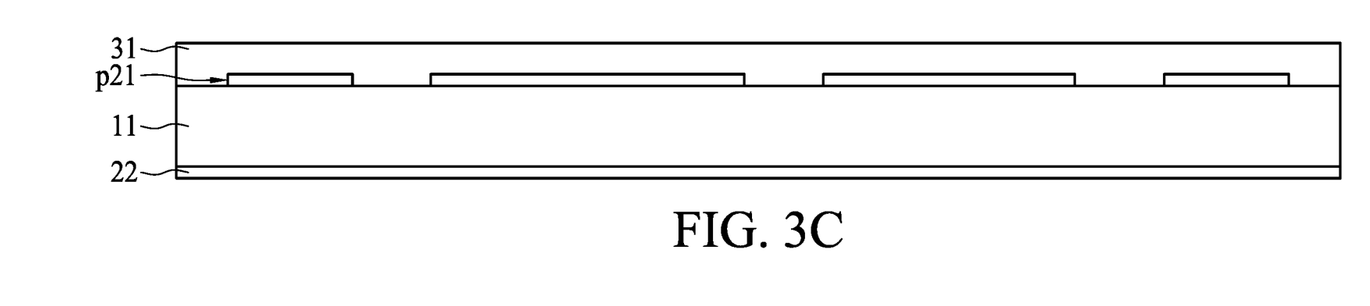

Next, referring to FIG. 3C, a first dielectric layer 31 is formed on the first surface 11a of the first carrier 10, covering the patterned first conductive film p21. Suitable materials for the first dielectric layer 31 may be selected from those having desired adherence to facilitate attachment of, for example, a semiconductor device. In some embodiments, the first dielectric layer 31 includes resin. Moreover, the first dielectric layer 31 may be free from fillers such as glass fibers. In an embodiment, the first dielectric layer 31 is approximately 35 μm in thickness.

Figure 3D:
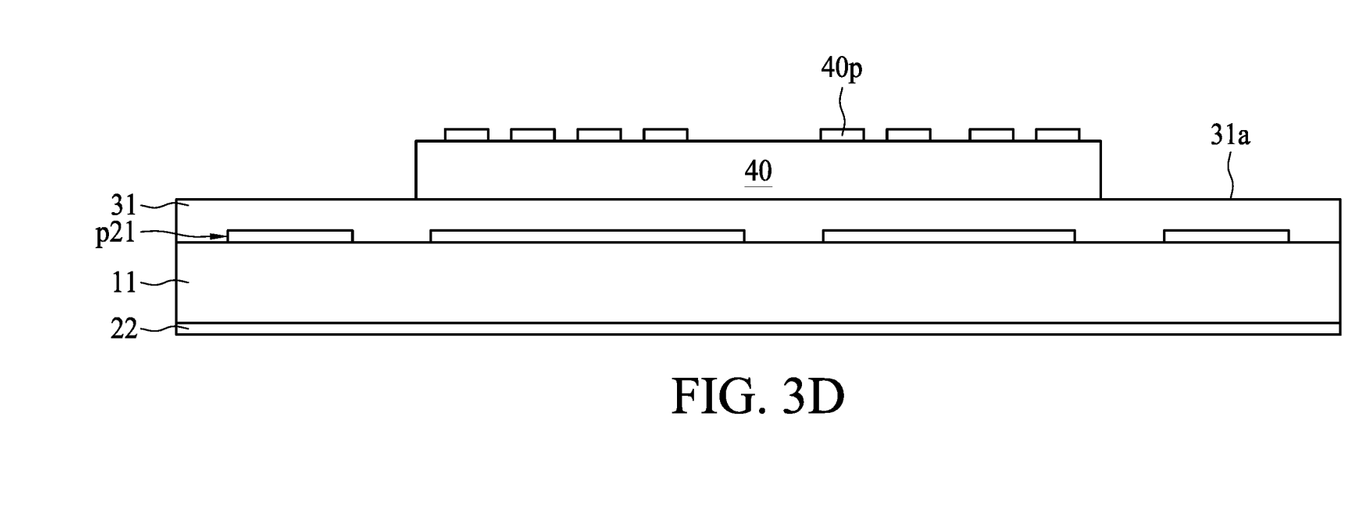

Afterwards, referring to FIG. 3D, a semiconductor device 40 is attached onto the first dielectric layer 31. The semiconductor device 40 is oriented "face-up" with its conductive pads 40p facing away from the first dielectric layer 31. The semiconductor device 40 may include an active device or a passive device.

Figure 3E:
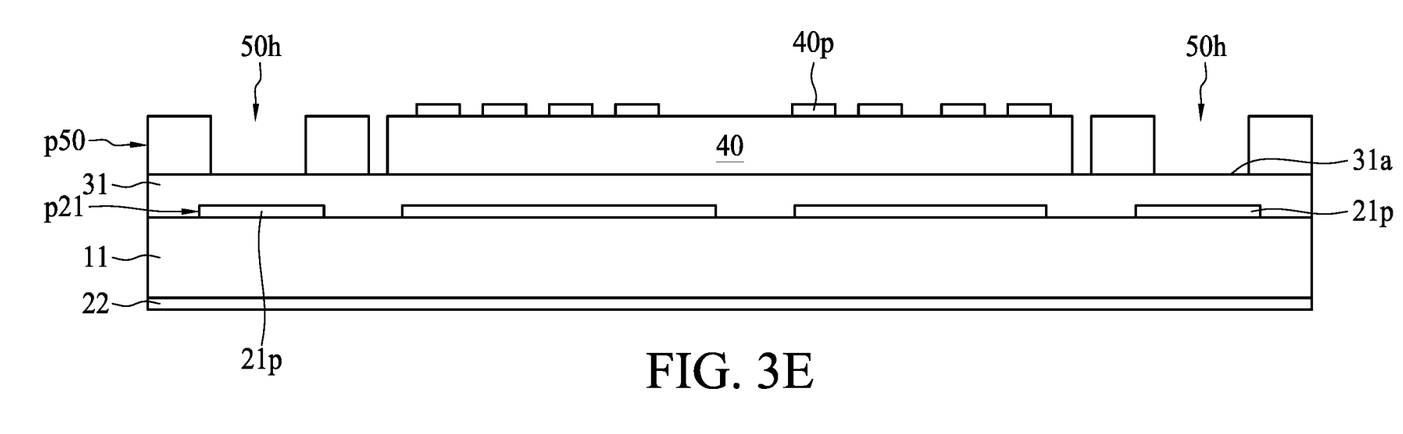

Referring to FIG. 3E, a patterned core layer p50 is attached on the first dielectric layer 31. The patterned core layer p50, which may be formed in a similar fashion as described and illustrated with reference to FIG. 2C, includes an organic material that further includes fillers such as glass fibers. In addition, also referring to FIGS. 2C and 2D, the patterned core layer p50 is provided with first openings 50h and a second opening or cavity 40h. After the patterned core layer p50 is attached, the first openings 50h may each correspond in position to a conductive pad 21p in the patterned first conductive film p21, while the second opening 40h accommodates the semiconductor device 40. Each of the first openings 50h defines a passage extending through the patterned core layer p50 towards a corresponding conductive pad 21p. In an embodiment, the patterned core layer p50 has a thickness ranging from approximately 50 μm to approximately 150 μm. In addition, the patterned core layer p50 may be lower than the semiconductor device 40 by approximately 10 μm.

In the present embodiment, the semiconductor device 40 is attached before the patterned core layer p50 is attached. In another embodiment, however, the semiconductor device 40 may be attached after the patterned core layer p50 is attached. Accordingly, attachment of the semiconductor device 40 and the patterned core layer p50 is interchangeable in order.

Figure 3F:
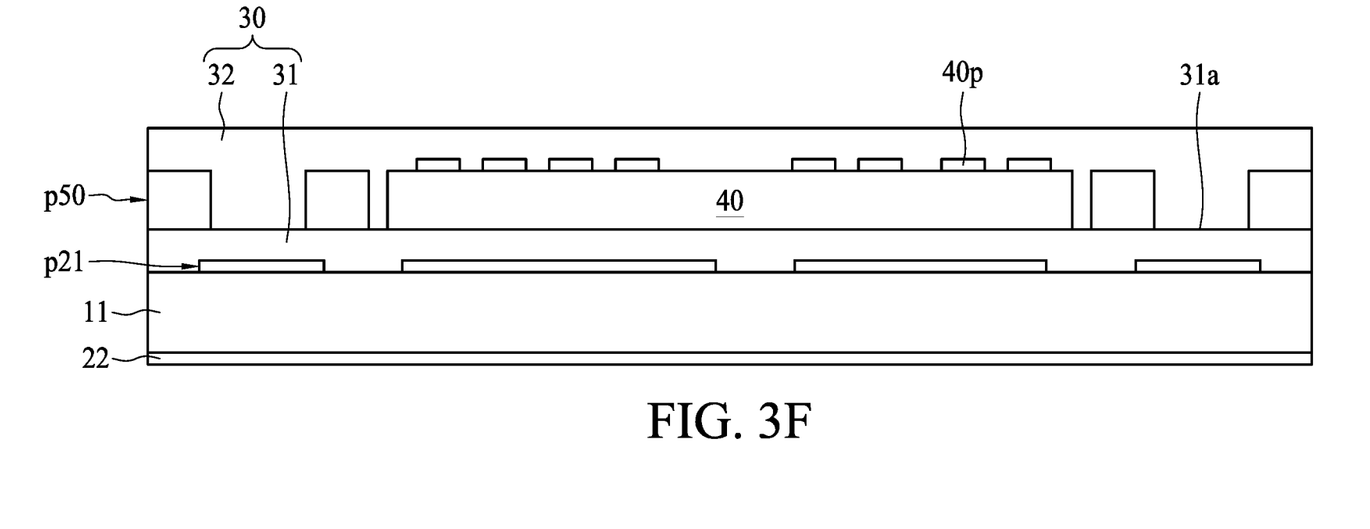

Referring now to FIG. 3F, a second dielectric layer 32 is formed on the first dielectric layer 31 and the patterned core layer p50, covering the semiconductor device 40 and filling the defined passages. The second dielectric layer 32 and the first dielectric layer 31 together constitute the dielectric layer 30 as described and illustrated with reference to FIG. 1. Suitable materials for the second dielectric layer 32 are similar to or identical with those for the first dielectric layer 31. In particular, like the first dielectric layer 31, the second dielectric layer 32 may include resin free from glass fibers. In an embodiment, the second dielectric layer 32 has a thickness ranging from approximately 35 μm to approximately 75 μm.

Figure 3G:
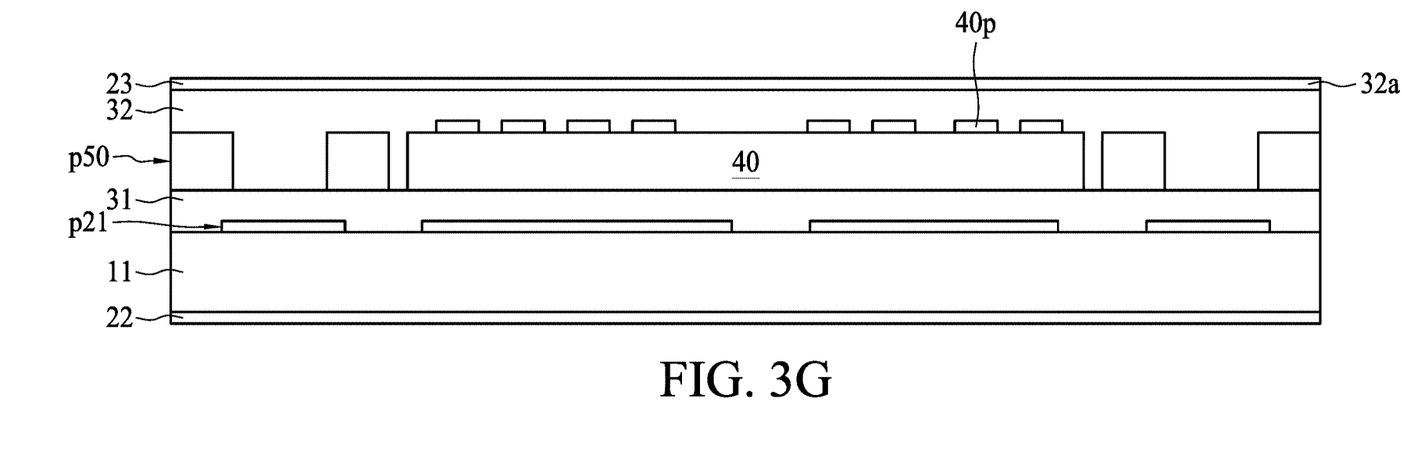

Referring to FIG. 3G, a first conductive foil 23 is formed on a surface 32a of the second dielectric layer 32 in, for example, a lamination process. Suitable materials for the first conductive foil 23 may include Cu. In an embodiment, the first conductive foil 23 has a thickness of approximately 5 μm.

Subsequently, referring to FIG. 3H, the first conductive foil 23 is patterned, resulting in a patterned first conductive foil p23. The patterned first conductive foil p23 exposes first portions (not numbered) of the second dielectric layer 32, which are disposed over the passages defined by the first openings 50h and correspond in position to the conductive pads 21p in the patterned first conductive film p21. In addition, the patterned first conductive foil p23 exposes second portions (not numbered) of the second dielectric layer 32, which correspond in position to the conductive pads 40p of the semiconductor device 40.

Then, first openings 21h are formed into the exposed first portions in, for example, a laser drilling process that may use carbon dioxide ($CO_2$) laser, exposing the conductive pads 21p in the patterned first conductive film p21. The first openings 21h extend through the second dielectric layer 32, the defined passages and the first dielectric layer 31 towards the conductive pads 21p. Each of the first openings 21h has a diameter smaller than that of a corresponding passage. In addition, second openings 41h are formed into the exposed second portions by using, for example, a blasting process, exposing the conductive pads 40p of the semiconductor device 40.

Figure 3H:
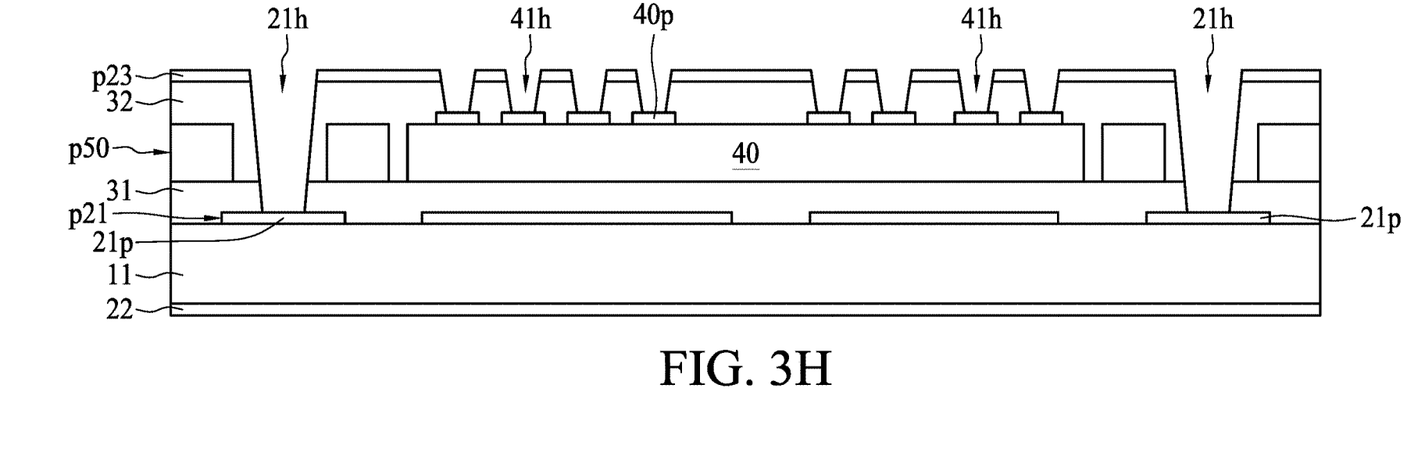
Figure 3I:
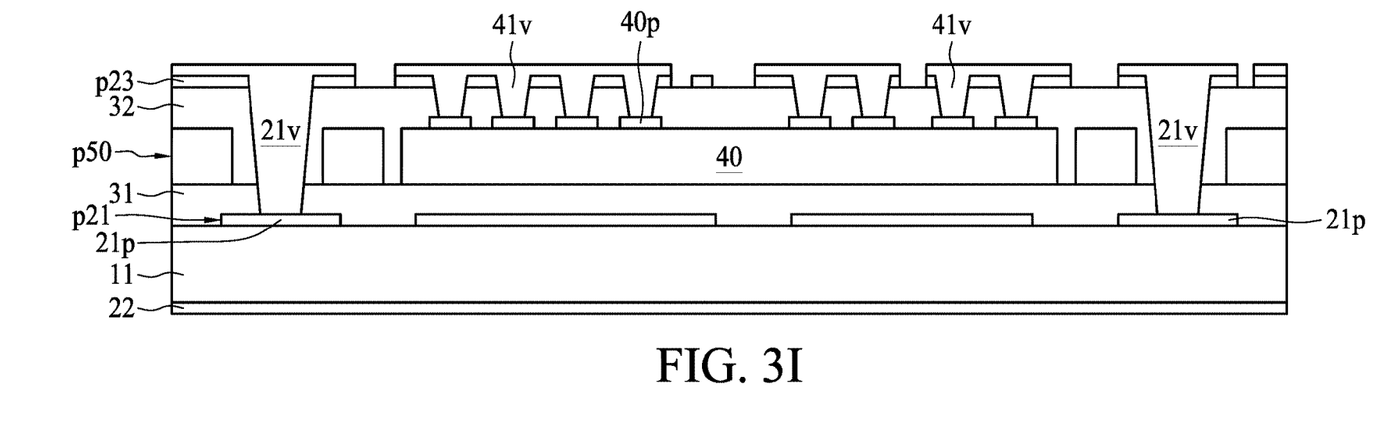

Next, referring to FIG. 3I, a first conductive layer is formed on the patterned first conductive foil p23 in, for example, a plating process. The first conductive layer fills the first openings 21h and the second openings 41h, resulting in first conductive vias 21v and second conductive vias 41v, respectively. In the present embodiment, the first conductive vias 21v taper towards the patterned first conductive film p21. The first conductive layer also disposed on the patterned first conductive foil p23. The patterned first conductive foil p23 is subjected to a patterning process to electrically isolate some of these conductive vias 21v and 41v and define conductive traces for electric interconnection.

In the present embodiment, laser is applied at a first pulsed energy through the second dielectric layer 32 and the first dielectric layer 31, which may include a similar or identical dielectric material that is free from any glass fibers. As a result, the laser runs through a layer of one similar or identical material (i.e., dielectric material), and thus removes the second dielectric layer 32 and the first dielectric layer 31 at substantially the same rate. Moreover, since the first opening 21h has a diameter smaller than that of a corresponding passage, the first conductive vias 21v, formed by filling the first opening 21h with a conductive material, as a matter of course has a diameter smaller than that of the corresponding passage. Accordingly, the first conductive via 21v does not physically contact the patterned core layer p50. In particular, also referring to FIGS. 2D and 2E, even though, which may however be insignificant, a portion of glass fibers 50f during formation of the patterned core layer p50 may protrude into a defined passage from a wall 50w of the patterned core layer p50, such glass fibers 50f are later covered by the second dielectric layer 32 and spaced apart from the subsequently formed first conductive via 21v.

In some existing approaches, unlike the patterned core layer p50 according to the present disclosure, a core layer filled with glass fibers is not provided with such first openings 50h and hence no passages are defined. As a result, during formation of the first openings 21h in a laser drilling process, the laser runs through different materials (i.e., a dielectric layer free of glass fibers and a core layer filled with glass fibers), and removes the dielectric layer and the core layer at different rates. Specifically, given a same pulsed energy applied, the dielectric layer free of glass fibers has a higher removal rate than the core layer provided with glass fibers. Consequently, significant residual glass fibers are exposed from the wall of the core layer. Such glass fibers adversely affect the reliability and quality of a later formed conductive via. Specifically, the exposed glass fibers cause ring-shape discontinuous regions in the conductive via and as a result electrical disconnection of the conductive via. The existing approaches may thus not conform to the requirements as specified in the IPC-A-600H standard.

By comparison, in the present disclosure, a core layer is patterned beforehand with an opening to define a passage to allow a later formed conductive via to extend therethrough. The passage has a larger diameter than a to-be-formed conductive via so that residual glass fibers, if any, are spaced apart from the conductive via and do not hamper the formation of the conductive via. As a result, with the patterned core layer p50, the problem of electrical disconnection in conductive vias is significantly alleviated or solved.

Figure 3J:
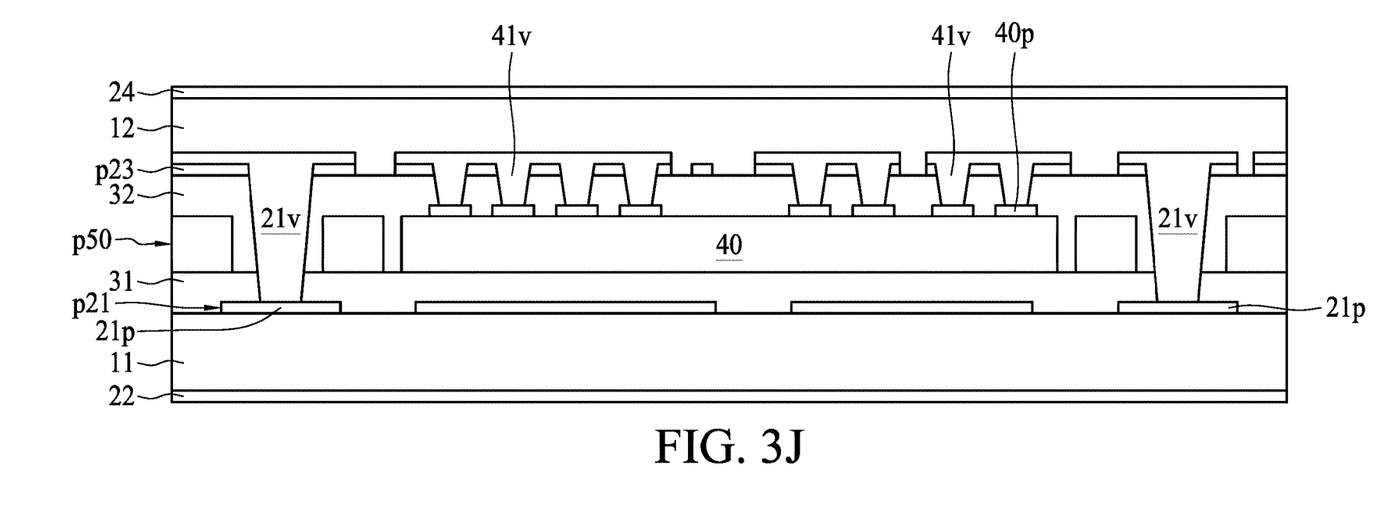

Referring to FIG. 3J, a dielectric layer 12 provided with a second conductive foil 24 is formed on the patterned first conductive foil p23, the first conductive vias 21v and the second conductive vias 41v in, for example, a lamination process. Suitable materials for the dielectric layer 12 and the second conductive foil 24 are similar to or identical with those for the dielectric layer 11 and the first conductive foil 23, respectively. In particular, the dielectric layer 12 also includes fillers such as glass fibers. In an embodiment, the dielectric layer 12 has a thickness of approximately 35 μm, and the second conductive foil 24 has a thickness of approximately 5 μm.

Figure 3K:
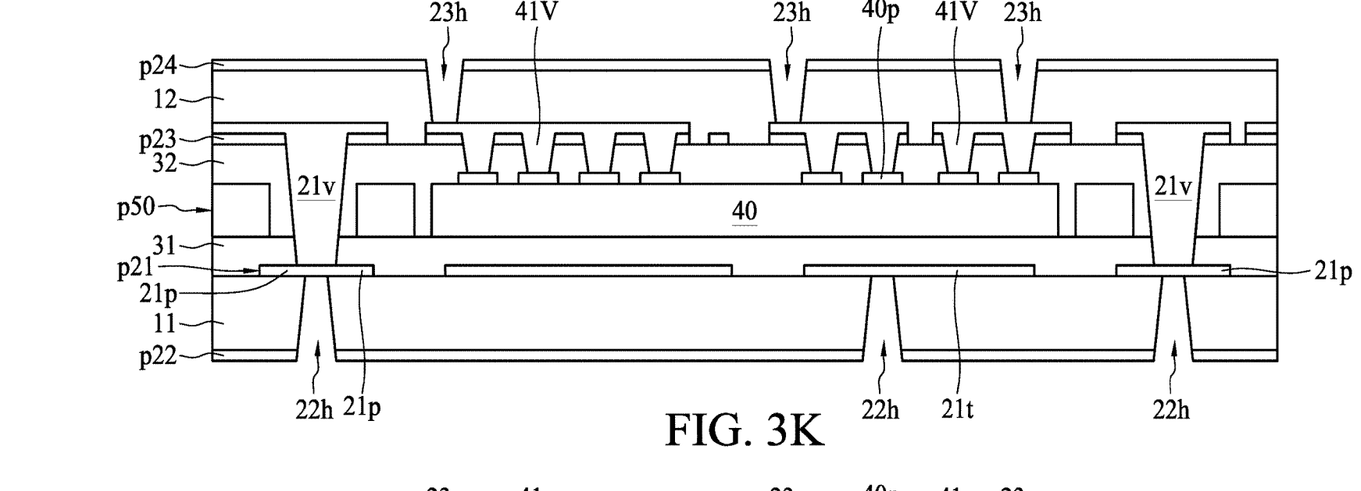

Referring to FIG. 3K, the second conductive foil 24 is patterned, resulting in a patterned second conductive foil p24. The patterned second conductive foil p24 exposes portions of the dielectric layer 12 over the semiconductor device 40. Subsequently, third openings 23h are formed into the dielectric layer 12 from the exposed portions thereof by using, for example, laser drilling, exposing portions of the second conductive vias 41v and portions of the patterned first conductive foil p23.

In addition, the second conductive film 22 is patterned, resulting in a patterned second conductive film p22, which exposes portions of the dielectric layer 11. Then, fourth openings 22h are formed into the dielectric layer 11 from the exposed portions thereof by using, for example, laser drilling, exposing portions of the conductive pads 21p or conductive traces 21t in the patterned first conductive film p21.

In some embodiments, the first openings 21h illustrated in FIG. 3H and the third openings 23h and fourth openings 22h illustrated in FIG. 3K are formed by using laser drilling. In forming the first openings 21h, which extend through a dielectric layer free from glass fibers, laser is applied at a first pulsed energy, as previously discussed. By comparison, in forming the third or fourth openings 23h, 22h, which extend through a dielectric layer filled with glass fibers, laser is applied at a second pulsed energy. The second pulsed energy is higher than the first pulsed energy.

Figure 3L:
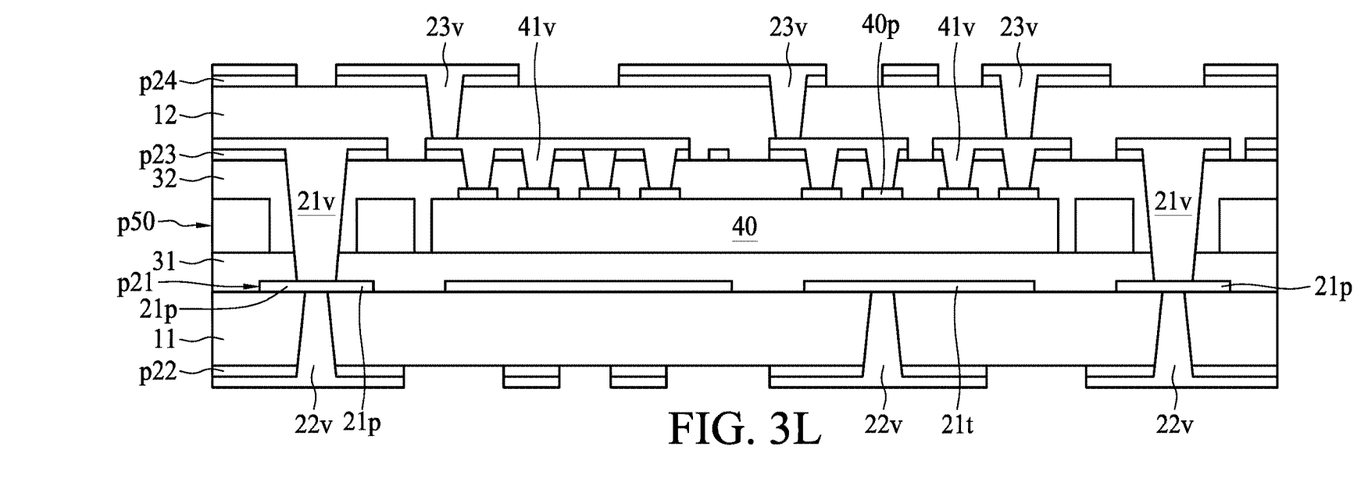

Subsequently, referring to FIG. 3L, a second conductive layer is formed on the patterned second conductive foil p24 in, for example, a plating process. The second conductive layer fills the third openings 23h, resulting in third conductive vias 23v. The second conductive layer also disposed on the patterned second conductive foil p24. The patterned second conductive foil p24 is then subjected to a patterning process to electrically isolate some of the third conductive vias 23v and define conductive traces for electric connection. Likewise, a third conductive layer is formed on the patterned second conductive film p22 in, for example, a plating process. The third conductive layer fills the fourth openings 22h, resulting in fourth conductive vias 22v. In the present embodiment, the fourth conductive vias 22v taper towards the patterned first conductive film p21. The third conductive layer also disposed on the patterned second conductive film p22. The patterned second conductive film p22 is then subjected to a patterning process to electrically isolate some of the fourth conductive vias 22v and define conductive traces for electric connection.

Next, referring back to FIG. 1, a protective coating 60 such as solder mask is applied on the patterned second conductive foil p24 and the patterned second conductive film p22, exposing the third conductive vias 23v and the fourth conductive vias 22v. The protective layer 60 helps control movement of solder balls (not shown) to be formed on the exposed third conductive vias 23v and fourth conductive vias 22v during soldering.

Figure 3M:
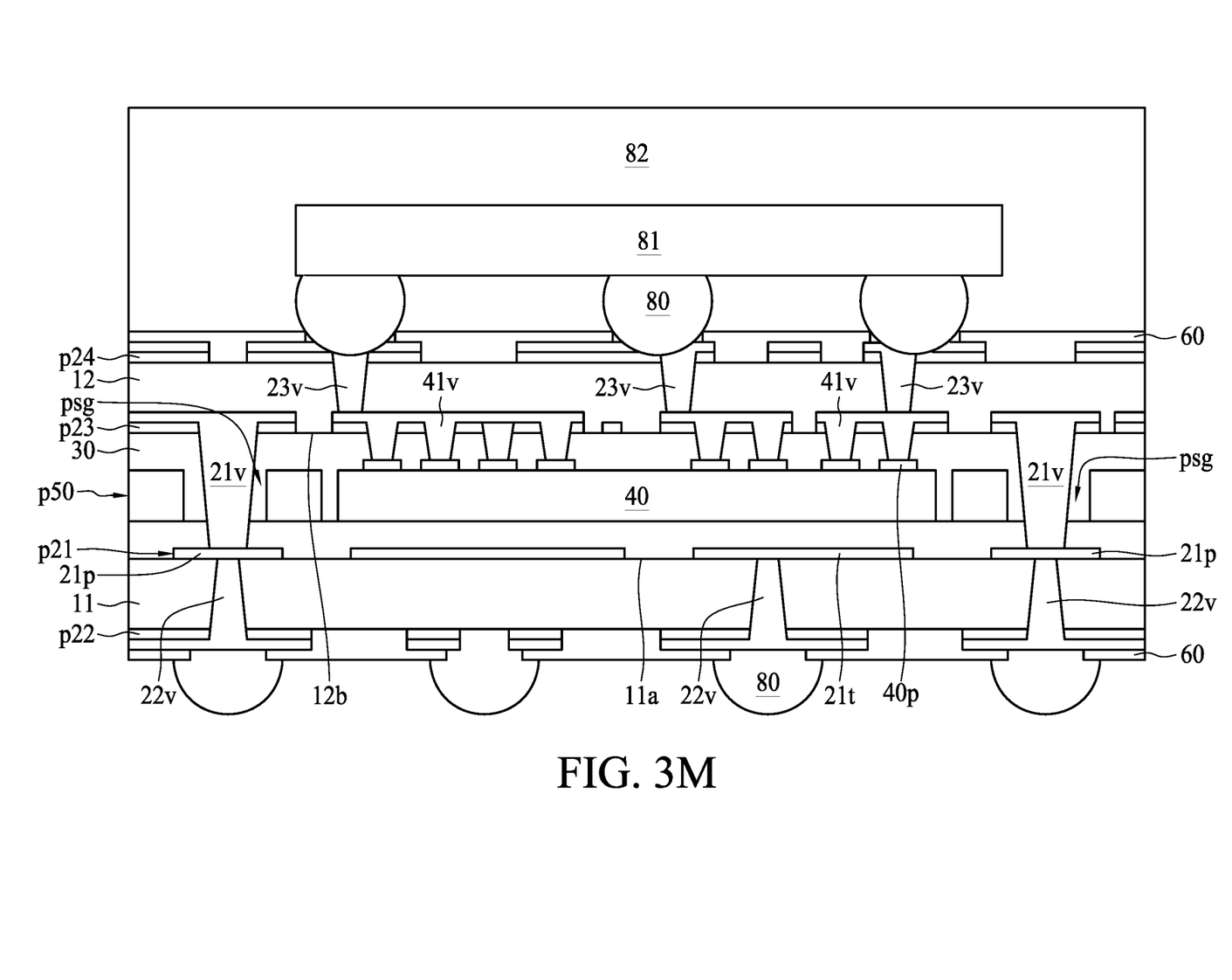

Referring to FIG. 3M, an electronic component 81 is disposed on the dielectric layer 12 and make electrical connection with the semiconductor device 40 through one or more electrical contacts 80, the patterned second conductive foil p24, the third conductive vias 23v, the second conductive vias 41v, and the conductive pads 40p. An encapsulating layer 82 is formed on the dielectric layer 12 to cover or encapsulate the electronic component 81. In some embodiments, the encapsulating layer 82 may be formed by a molding technique, such as transfer molding or compression molding. In some embodiments, one or more electrical contacts 80 may be provided on the dielectric layer 11 and electrically connect to the patterned second conductive film p22 and the fourth conductive vias 22v.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A substrate structure, comprising:
    a carrier;
    a dielectric layer on the carrier;
    a patterned organic core layer in the dielectric layer, the patterned organic core layer defining a passage extending in the dielectric layer towards the carrier; and
    a first conductive via extending through the passage towards the carrier without contacting the patterned organic core layer;
    wherein the dielectric layer comprises a first dielectric layer disposed on the carrier and a second dielectric layer disposed on the first dielectric layer;
    wherein the patterned organic core layer is embedded between the first dielectric layer and the second dielectric layer; and
    wherein the first conductive via tapers toward the carrier.
2. The substrate structure of claim 1, wherein a portion of the first conductive via located in the passage is full.
3. The substrate structure of claim 1, further comprising:
    a second conductive via overlapping the first conductive via in a direction substantially perpendicular to a surface of the carrier over which the first dielectric layer is disposed.
4. The substrate structure of claim 3, wherein the first conductive via and the second conductive via are aligned in a cross-sectional perspective.
5. The substrate structure of claim 1, further comprising:
    a second conductive via penetrating through the carrier and tapering toward the first conductive via.
6. The substrate structure of claim 5, wherein the first conductive via and the second conductive via taper toward opposite directions.
7. The substrate structure of claim 1, wherein a bottom surface of the first dielectric layer is substantially coplanar with a top surface of the carrier.
8. The substrate structure of claim 7, wherein the bottom surface of the first dielectric layer is substantially coplanar with a bottom surface of a conductive film disposed on the carrier.
9. The substrate structure of claim 8, wherein the bottom surface of the first dielectric layer is substantially coplanar with a top surface of a second conductive via penetrating through the carrier and tapering toward the conductive film.
10. The substrate structure of claim 1, further comprising:
    a conductive film disposed on the carrier and electrically connected with the first conductive via.
11. The substrate structure of claim 10, wherein the conductive film and the carrier are non-overlapping in a cross-sectional perspective along a direction substantially parallel to a surface of the carrier over which the first dielectric layer is disposed.
12. The substrate structure of claim 11, wherein the conductive film is electrically connected with a second conductive via tapering toward the conductive film.
13. The substrate structure of claim 1, wherein a portion of the first conductive via located in the passage is full, wherein a bottom surface of the first dielectric layer is substantially coplanar with a top surface of the carrier, and wherein the substrate structure further comprises:
    a second conductive via overlapping the first conductive via in a direction substantially perpendicular to a surface of the carrier over which the first dielectric layer is disposed, the second conductive via penetrating through the carrier and tapering toward the first conductive via; and
    a conductive film disposed on the carrier and electrically connected with the first conductive via.
14. A substrate structure, comprising:
    a first dielectric layer;
    a second dielectric layer disposed over the first dielectric layer;
    a patterned organic core layer disposed between the first dielectric layer and the second dielectric layer, wherein the patterned organic core layer defines a first opening and a plurality of second openings around the first opening;
    a semiconductor device disposed in the first opening;
    a plurality of conductive vias, each disposed in a corresponding one of the plurality of second openings;
    a conductive foil disposed on the second dielectric layer, wherein an inner lateral surface of the conductive foil is substantially aligned with an inner lateral surface of the second dielectric layer; and
    a seed layer contacting the inner lateral surface of the conductive foil and the inner lateral surface of the second dielectric layer.
15. The substrate structure of claim 14, wherein the seed layer contacts a top surface of the conductive foil.

16. The substrate structure of claim 14, wherein the patterned organic core layer directly contacts the first dielectric layer.

17. The substrate structure of claim 16, wherein the semiconductor device directly contacts the first dielectric layer.

18. The substrate structure of claim 14, wherein the patterned organic core layer is at an elevation lower than the semiconductor device with respect to a top surface of the second dielectric layer.

* * * * *